United States Patent
Kim et al.

(10) Patent No.: US 7,315,086 B2
(45) Date of Patent: Jan. 1, 2008

(54) CHIP-ON-BOARD PACKAGE HAVING FLIP CHIP ASSEMBLY STRUCTURE AND MANUFACTURING METHOD THEREOF

(75) Inventors: Dong-Han Kim, Gyeonggi-do (KR); Sa-Yoon Kang, Seoul (KR); Seok-Won Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 77 days.

(21) Appl. No.: 11/181,145

(22) Filed: Jul. 13, 2005

(65) Prior Publication Data

US 2006/0091511 A1   May 4, 2006

(30) Foreign Application Priority Data

Nov. 3, 2004   (KR) .................. 10-2004-0088783

(51) Int. Cl.
  *H01L 23/42* (2006.01)
  *H01L 23/58* (2006.01)
  *H01L 23/14* (2006.01)

(52) U.S. Cl. ............ 257/778; 257/702; 257/737; 257/E23.039

(58) Field of Classification Search ........... 257/778, 257/737, 702, 787, E23.039
See application file for complete search history.

(56) References Cited

U.S. PATENT DOCUMENTS

| | | | | |
|---|---|---|---|---|
| 5,990,546 A | * | 11/1999 | Igarashi et al. | 257/700 |
| 6,100,112 A | * | 8/2000 | Amano et al. | 438/106 |
| 6,323,058 B1 | * | 11/2001 | Murakamz et al. | 438/106 |
| 6,433,409 B2 | * | 8/2002 | Mita et al. | 257/673 |
| 6,995,476 B2 | * | 2/2006 | Hashimoto | 257/787 |
| 7,129,585 B2 | * | 10/2006 | Yoo | 257/778 |

FOREIGN PATENT DOCUMENTS

| | | | |
|---|---|---|---|
| EP | 0482940 | * | 10/1991 |
| JP | 05-047847 | | 2/1993 |
| JP | 07-169873 | | 7/1995 |
| KR | 1998-025889 | | 7/1998 |

OTHER PUBLICATIONS

English language abstract of the Korean Publication No. 1998-025889, Jul. 1998.
English language abstract of the Japanese Publication No. 05-047847, May 1993.
English language abstract of the Japanese Publication No. 07-169873, Jul. 1995.

* cited by examiner

*Primary Examiner*—Nitin Parekh
(74) *Attorney, Agent, or Firm*—Marger Johnson & McCollom, P.C.

(57) ABSTRACT

A chip-on-board (COB) package has a flip chip assembly structure and is used for an integrated circuit (IC) card. The COB package has conductive patterns as contact terminals on an outer surface of a non-conductive film, and an IC chip on an inner surface of the film. The film has a number of holes through which the conductive patterns are partly exposed. A number of conductive bumps on an active surface of the IC chip face the inner surface of the film and enter corresponding holes in the non-conductive film to mechanically join and electrically couple to the conductive patterns. The disclosed COB package and a related manufacturing method allow a reduction in production cost, simplified process, better electrical connections, and improved reliability.

20 Claims, 4 Drawing Sheets

CHIP-ON-BOARD PACKAGE HAVING FLIP CHIP ASSEMBLY STRUCTURE AND MANUFACTURING METHOD THEREOF

CROSS REFERENCE TO RELATED APPLICATIONS

This U.S. non-provisional application claims priority under 35 U.S.C. §119 from Korean Patent Application No. 2004-88783, which was filed in the Korean Intellectual Property Office on Nov. 3, 2004, the contents of which are incorporated by reference herein in its entirety.

BACKGROUND OF THE INVENTION

1. Field of the Invention

The present invention relates generally to semiconductor package technology and, more particularly, to a chip-on-board (COB) package having a flip-chip assembly structure and to a manufacturing method thereof.

2. Description of the Related Art

An integrated circuit (IC) card, in which an IC chip is contained, can substitute for a conventional magnetic card. Generally, the IC chip is assembled in the form of typical COB package and then embedded in the IC card.

FIG. 1 shows, in a cross-sectional view, a conventional COB package used for the IC card. Referring to FIG. 1, the COB package 10 mounts in a card body 9 through one surface of the card body 9. Conductive patterns such as metal patterns 11 formed on the COB package 10 and exposed outside the card body 9 act as contact terminals of the IC card.

The metal patterns 11 are formed on an outer surface 12a of a thin, non-conductive film 12. An IC chip 13 is attached on an inner surface 12b of the non-conductive film 12. The non-conductive film 12 has several holes 12c formed near the IC chip 13. Metal wires 14 electrically couple the IC chip 13 to the metal patterns 11 through the holes 12c in the non-conductive film 12. The IC chip 13 and the metal wires 14 are encapsulated in a mold resin 15 provided on the inner surface 12b of the non-conductive film 12. The mold resin 15 may protect and fix the IC chip 13 and the metal wires 14.

A typical package assembly process may be used to manufacture the aforementioned conventional COB package 10. Therefore, mass-productivity may be a merit of the conventional COB package 10. However, the IC card can be very thin, e.g., less than one millimeter thick, and can be inherently flexible. The conventional COB package 10 may tend to be affected by external force. In the conventional COB package 10, an active surface 13a of the IC chip 13 faces toward the inside of the card body 9 while the metal patterns 11 face toward the outside of the card body 9. This makes the length of the metal wire 14 relatively longer. Often, poorer electrical connections arise from longer metal wires 14 in spite of protection by the mold resin 15.

FIG. 2 shows in cross-section another conventional COB package used for the IC card. COB package 20 has a flip chip assembly structure instead of the metal wires and the mold resin as discussed above.

Referring to FIG. 2, an active surface 23a of an IC chip 23 faces toward a non-conductive film 22. Conductive bumps such as metal bumps 24 are formed on the active surface 23a of the IC chip 23, and second metal patterns 21a are formed on an inner surface 22b of the non-conductive film 22. The second metal patterns 21a are electrically coupled through interconnection vias 21b to first metal patterns 21 formed on an outer surface 22a of the non-conductive film 22. The metal bumps 24 are mechanically joined to the second metal patterns 21a, providing electrical paths between the IC chip 23 and the first metal patterns 21.

Metal bumps 24 provide relatively shorter and more reliable electrical paths. The above-discussed flip chip assembly structure may not only have less possibility of poor electrical connections, but also may have no need of the mold resin. Conventional COB package 20, however, necessarily requires the second metal patterns 21a on the inner surface 22b of the non-conductive film 22. This represents greater production cost in comparison with the previous example using the metal wires.

The first and second metal patterns 21 and 21a may be formed from metal plates, which are bonded to both surfaces 22a and 22b of the non-conductive film 22 and then patterned by selective etching in a photolithographic process. Therefore, using the second metal patterns 21a as well as the metal bumps 24 may incur relatively higher production cost in comparison with using the metal wires. The process of forming the second metal patterns 21a may be carried out separately from the process of forming the first metal patterns 21. As a result, this conventional COB package 20 may have no significant advantage in its manufacturing method.

SUMMARY OF THE INVENTION

Exemplary, non-limiting embodiments of the present invention provide a structure and a manufacturing method of a chip-on-board (COB) package allowing a reduction in production cost, simplified process, better electrical connections, and improved reliability.

According to an exemplary embodiment of the present invention, the COB package comprises a non-conductive film, metal patterns, an integrated circuit (IC) chip, and a number of metal bumps. The non-conductive film has a first surface, a second surface opposite to the first surface, and a number of holes. The metal patterns are formed on the first surface of the non-conductive film, but partly exposed through the holes of the non-conductive film. The IC chip has an active surface facing the second surface of the non-conductive film. The metal bumps are formed on the active surface of the IC chip and insertable into the holes of the non-conductive film to mechanically join and electrically couple to the metal patterns.

In the COB package, the metal bumps may have a height greater than the thickness of the non-conductive film. For example, the height of the metal bump may be about 40 μm, e.g., between about 30 μm and about 50 μm, and the thickness of the non-conductive film may be about 10 μm to about 20 μm.

Further, the metal bumps may be made of gold and the non-conductive film may be made of epoxy or polyimide. The width of the metal bumps may be about 20 μm and the diameter of the holes may be about 1 mm.

According to another exemplary embodiment of the present invention, the method of manufacturing a COB package comprises forming holes in a non-conductive film having a first surface and a second surface opposite to the first surface; forming metal patterns on the first surface of the non-conductive film to partly expose the metal patterns through the holes; forming metal bumps on an active surface of an integrated circuit (IC) chip; disposing the IC chip relative to the second surface of the non-conductive film to insert the metal bumps into the holes of the non-conductive film; and mechanically joining and electrically coupling the metal bumps and the metal patterns.

In the method, the forming of the holes may be carried out using a punch. Further, the forming of the metal patterns may include bonding a metal plate to the first surface of the non-conductive film and thereafter photo-etching the metal plate. Additionally, the forming of the metal bumps may be carried out using electroplating or stud bumping.

In an alternative embodiment of the invention, the method may further comprise, before the joining of the metal bumps, providing a non-conductive adhesive between the active surface of the IC chip and the second surface of the non-conductive film.

Exemplary, non-limiting embodiments of the present invention provide an IC card having a thin and flexible card body and the above-discussed COB package. The COB package is mounted in the card body through one surface of the card body, and the metal patterns of the package are exposed outside the card body to act as contact terminals of the IC card.

DETAILED DESCRIPTION OF EXEMPLARY EMBODIMENTS OF THE INVENTION

Figure 1:
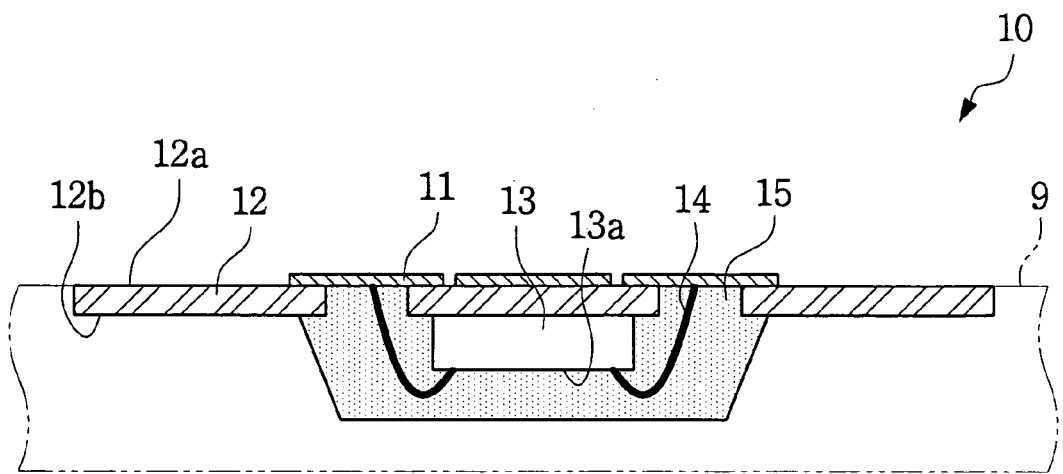
FIG. 1 is a cross-sectional view showing a conventional COB package used for an IC card.
Figure 2:
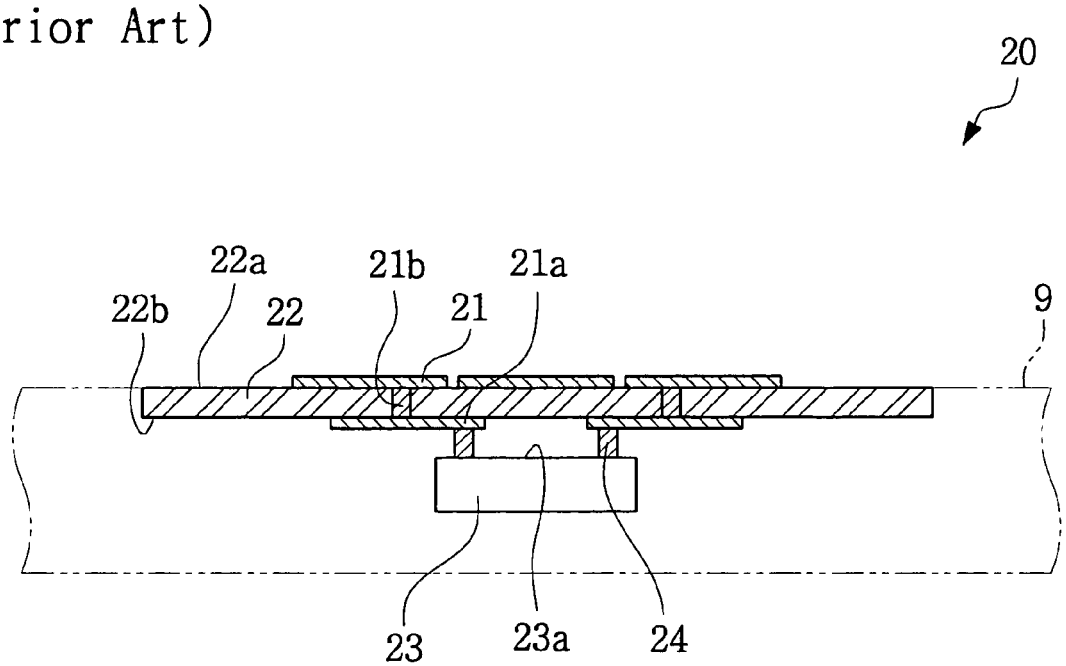
FIG. 2 is a cross-sectional view showing another convention COB package used for the IC card.

Exemplary, non-limiting embodiments of the present invention will now be described more fully hereinafter with reference to the accompanying drawings. This invention, however, may be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

In this disclosure, well-known structures and processes are not described or illustrated in detail to avoid obscuring the present invention. Furthermore, the figures in the drawings are not drawn to scale. Rather, for simplicity and clarity of illustration, the dimensions of some of the elements are exaggerated relative to other elements. Like reference numerals are used for like and corresponding parts of the various drawings.

Figure 3:
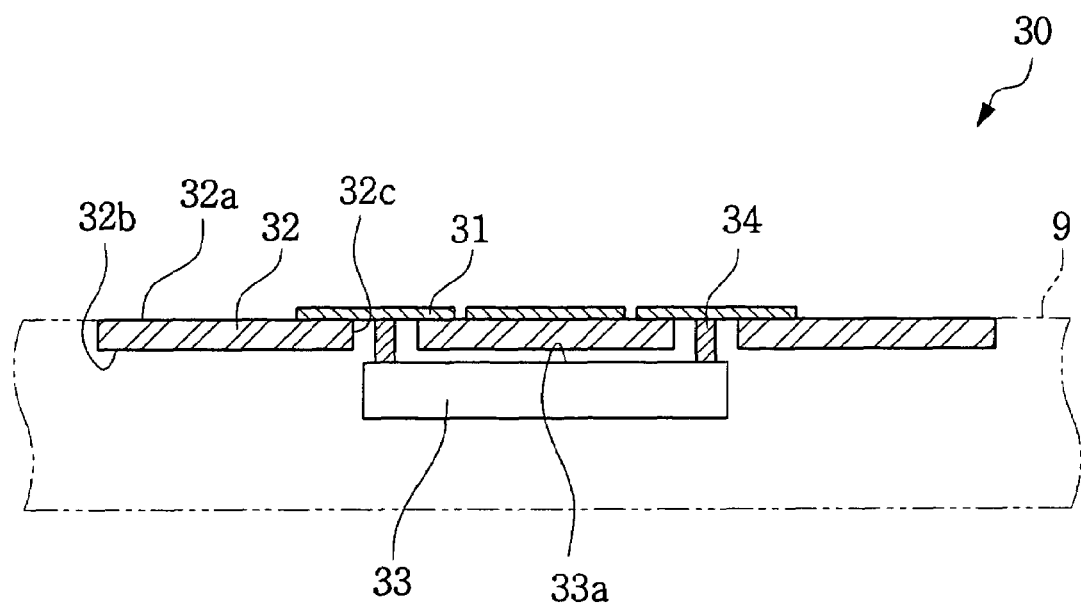
FIG. 3 is a cross-sectional view showing a COB package of a flip chip assembly structure in accordance with an exemplary embodiment of the present invention.

FIG. 3 shows, in a cross-sectional view, a COB package of a flip chip assembly structure in accordance with an exemplary embodiment of the present invention.

Referring to FIG. 3, the COB package 30 is mounted in a card body 9 through one surface of the card body 9. The COB package 30 has metal patterns 31 exposed to the outside of the card body 9 to act as contact terminals of the IC card. The metal patterns 31 are formed on an outer surface 32a of a thin, non-conductive film 32. The metal patterns 31 may be made of copper, for example, and may be plated with, for example, gold. The non-conductive film 32 may be made of resin material such as epoxy or polyimide and have a thickness of about 10 µm to about 20 µm.

The non-conductive film 32 has a number of holes 32c through which the metal patterns 31 are partly exposed. An IC chip 33 faces an inner surface 32b of the non-conductive film 32. More particularly, an active surface 33a of the IC chip 33 faces the inner surface 32b of the non-conductive film 32. Metal bumps 34 are formed on the active surface 33a of the IC chip 33.

The metal bumps 34 are locatable in the holes 32c of the non-conductive film 32 to thereby mechanically join and electrically couple to the metal patterns 31. Therefore, the metal bumps 34 may have a height greater than the thickness of the non-conductive film 32. The height of the metal bumps 34 may be about 40 µm, for example. Further, the metal bumps 34 may have a width smaller than the diameter of the hole 32c. For example, if the diameter of a hole 32c is about 1 mm, the width of the corresponding metal bump 34 can be about 20 µm. The metal bump 34 may be made of gold or other suitable metals.

As discussed above, the metal bumps 34 are directly connected to the metal patterns 31 through the holes 32c. It is thereby unnecessary to form additional metal patterns on the inner surface 32b of the non-conductive film 32. Further, since the metal bumps 34 replace conventional metal wires; the COB package 30 may have no need of conventional mold resin.

FIGS. 4A to 4D show, in cross-sectional views, a method of manufacturing the COB package in accordance with an exemplary embodiment of the present invention. From the description of the method, the structure of the COB package will be further disclosed.

Figure 4A:
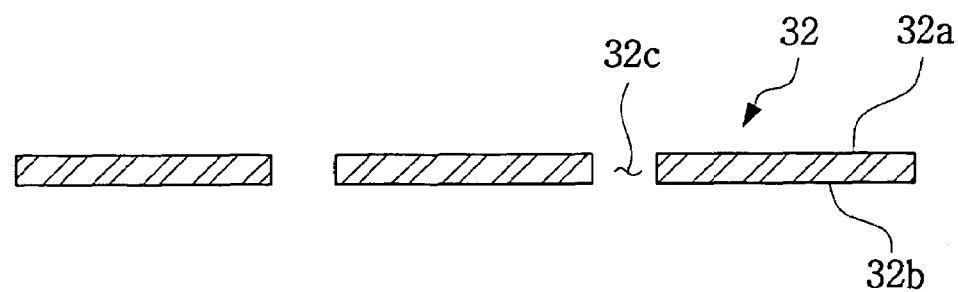
FIGS. 4A to 4D are cross-sectional views showing a method of manufacturing the COB package in accordance with an exemplary embodiment of the present invention.

FIG. 4A illustrates a step of forming the holes 32c at proper positions of the non-conductive film 32. The positions of the holes 32c correspond to the locations of the metal bumps on the IC chip. The holes 32c may be formed using suitable piercing tool such as a punch.

Figure 4B:
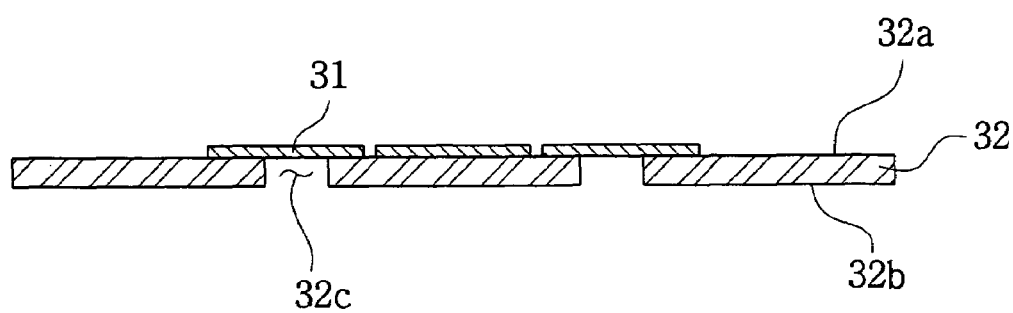

In FIG. 4B, the metal patterns 31 are formed on the outer surface 32a of the non-conductive film 32. The metal patterns 31 may be formed from a metal plate first bonded to the outer surface 32a of the non-conductive film 32 and then patterned by photo etching. The bottom of the metal patterns 31 is partly exposed through the holes 32c for connections with the metal bumps 34.

Figure 4C:
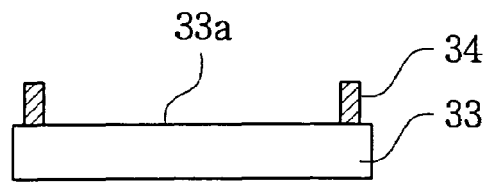

As shown in FIG. 4C, the metal bumps 34 are formed on the active surface 33a of the IC chip 33. As well known in the art, the IC chip 33 has a number of input/output pads (not shown) arranged on the active surface 33a, and the metal bumps 34 may be formed on the respective input/output pads. The metal bumps 34 may be formed using electroplating, stud bumping, or other suitable known bump-forming techniques.

Figure 4D:
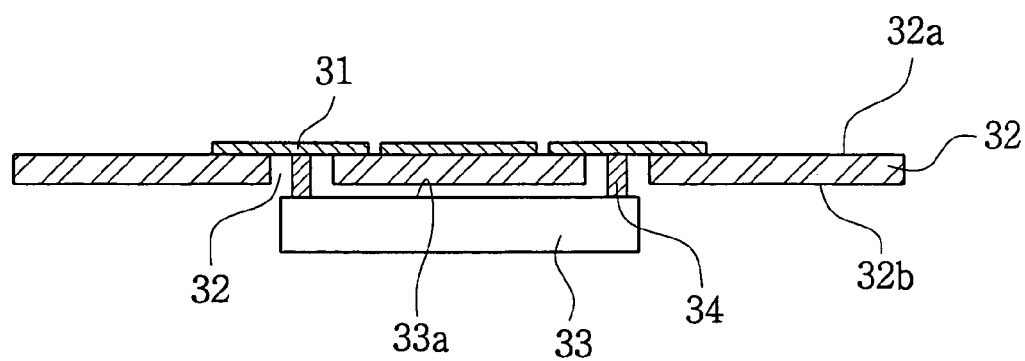

Thereafter, as shown in FIG. 4D, the IC chip 33 is positioned relative to the inner surface 32b of the non-conductive film 32 such that the metal bumps 34 enter into the holes 32c. Corresponding ones of the metal bumps 34 and the metal patterns 31 are mechanically joined and electrically coupled to each other with suitable heat, pressure and/or vibration applied thereto.

In an alternative embodiment, before the metal bumps 34 are joined to the metal patterns 31, a non-conductive adhesive may be interposed between the active surface 33a of the IC chip 33 and the inner surface 32b of the film 32 to enhance connection reliability therebetween. The non-conductive adhesive may be, for example, a laminated adhesive tape or adhesive paste.

As discussed above, the COB package according to the present invention has single-sided metal patterns, e.g., formed on only one surface of the non-conductive film. In comparison with conventional double-sided metal patterns, therefore, the COB package of the present invention may have the advantage of reduced production cost. Further, the COB package of embodiments of the present invention may be manufactured through more simplified process since it does not necessarily require additional metal patterns, metal wires and mold resin. As a result, embodiments of the present invention provide a cost-effective IC card.

In addition, the COB package according to embodiments of the present invention adopts the flip chip assembly structure in which the metal bumps provide electrical connections instead of conventional metal wires. Accordingly, embodiments of the present invention may not only avoid poor electrical connections in the COB package, but also improve reliability of the IC card.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A chip-on-board package comprising:
   a non-conductive film having a first surface, a second surface opposite the first surface, and a plurality of holes there through;
   conductive patterns formed on the first surface of the non-conductive film with a portion of the conductive patterns overlying and exposed through the plurality of holes of the non-conductive film, respectively;
   an integrated circuit chip having an active surface facing the second surface of the non-conductive film and having a plurality of conductive bumps formed on the active surface, the plurality of conductive bumps formed to respectively pass through the holes of the non-conductive film to be directly coupled to the conductive patterns respectively exposed through the holes without presence of any filling material through the holes, and wherein a height of the plurality of conductive bumps substantially exceeds a thickness of the non-conductive film to prevent the integrated circuit chip from contacting the non-conductive film.

2. The package of claim 1, wherein the height of the at least one of the conductive bumps is between about 30 μm and about 50 μm and wherein the thickness of the non-conductive film is between about 10 μm and about 20 μm.

3. The package of claim 1, wherein a ratio of the thickness of the non-conductive film to the height of the at least one of the conductive bumps is between about 0.33 and about 0.40.

4. The package of claim 1, wherein the at least one of the conductive bumps comprise gold.

5. The package of claim 1, wherein the non-conductive film comprises at least one of epoxy and polyimide.

6. The package of claim 1, wherein a width of the at least one of the conductive bumps is about 20 μm.

7. The package of claim 1, wherein a diameter of the at least one of the holes is about 1 mm.

8. The package of claim 1, wherein each of the plurality of conductive bumps is a single unitary structure.

9. An integrated circuit card comprising:
   a flexible card body; and
   a chip-on-board package mounted in the card body through one surface of the card body, the chip-on-board package including:
   a non-conductive film having a first surface, a second surface opposite to the first surface, and a plurality of holes there through;
   a plurality of metal elements corresponding to the plurality of holes, each metal element being disposed on the first surface of the non-conductive film and exposed through a corresponding one of the plurality of holes;
   an integrated circuit chip having an active surface facing the second surface of the non-conductive film;
   a plurality of conductive bumps corresponding to the plurality of holes, formed on the active surface of the integrated circuit chip, and insertable into a corresponding one of the plurality of holes to mechanically join and electrically couple there through with a corresponding one of the plurality of metal elements thereby made available as an exposed contact terminal of the integrated circuit card, wherein the width of the conductive bumps is substantially smaller than the diameter of the corresponding holes in the non-conductive film, the conductive bumps being spaced apart from sidewalls of the holes without presence of any filling material through the holes, and wherein a height of the plurality of conductive bumps substantially exceeds a thickness of the non-conductive film to prevent the integrated circuit chip from contacting the non-conductive film.

10. The integrated circuit card of claim 9, wherein the height of the at least one of the conductive bumps is between about 30 μm and about 50 μm and wherein the thickness of the non-conductive film is between about 10 μm and about 20 μm.

11. The integrated circuit card of claim 9, wherein a ratio of the thickness of the non-conductive film to the height of at least one of the conductive bumps is between about 0.33 and about 0.40.

12. The integrated circuit card of claim 9, further comprising a non-conductive adhesive interposed between the active surface of the integrated circuit chip and the second surface of the non-conductive film.

13. A chip-on-board package comprising:
   a non-conductive film having plurality of holes coupling a first surface and a second surface thereof;
   a plurality of metal elements formed on the first surface of the non-conductive film, at least one of the plurality of metal elements being exposed through a corresponding at least one of the plurality of holes;
   an integrated circuit chip having an active surface facing the second surface of the non-conductive film and presenting thereon a plurality of conductive bumps corresponding to the plurality of holes, wherein at least one of the plurality of conductive bumps is formed to respectively pass through one of the holes of the non-conductive film without contacting sidewalls of the hole to mechanically and being electrically coupled to the conductive pattern respectively exposed through the hole without presence of any filling material through the holes, and wherein a height of the plurality of conductive bumps substantially exceeds a thickness of the non-conductive film to prevent the integrated circuit chip from contacting the non-conductive film.

14. A chip-on-board package according to claim 13, wherein each of the plurality of conductive bumps mechanically contacts and electrically couples to the plurality of metal elements respectively exposed through the plurality of holes.

15. A chip-on-board package according to claim 13, wherein a ratio of the thickness of the non-conductive film to the height of the at least one of the conductive bumps is between about 0.20 and about 0.66.

16. A chip-on-board package according to claim 13, wherein the height of the at least one of the conductive bumps is between about 30 μm and about 50 μm and wherein the thickness of the non-conductive film is between about 10 μm and about 20 μm.

17. A chip-on-board package according to claim 13, wherein the at least one of the conductive bumps comprise gold.

18. A chip-on-board package according to claim 13, wherein the non-conductive film comprises at least one of epoxy and polyimide.

19. A chip-on-board package according to claim 13, wherein a width of the at least one of the conductive bumps is about 20 μm.

20. A chip-on-board package according to claim 13, wherein a diameter of the at least one of the holes is about 1 mm.

* * * * *